(12) United States Patent
Kim

(10) Patent No.: US 7,910,412 B2
(45) Date of Patent: *Mar. 22, 2011

(54) METHOD OF FABRICATING AN ARRAY SUBSTRATE

(75) Inventor: Dong-Hee Kim, Taegu (KR)

(73) Assignee: LG Display Co., Ltd., Seoul (KR)

( * ) Notice: Subject to any disclaimer, the term of this patent is extended or adjusted under 35 U.S.C. 154(b) by 158 days.

This patent is subject to a terminal disclaimer.

(21) Appl. No.: 11/647,587

(22) Filed: Dec. 28, 2006

(65) Prior Publication Data

US 2007/0109478 A1    May 17, 2007

Related U.S. Application Data

(63) Continuation of application No. 09/793,103, filed on Feb. 27, 2001, now Pat. No. 7,223,621.

(30) Foreign Application Priority Data

Feb. 28, 2000    (KR) .................................. 2000-9796

(51) Int. Cl.
*H01L 21/00* (2006.01)

(52) U.S. Cl. .................. 438/149; 438/151; 257/E51.005

(58) Field of Classification Search .................. 438/149, 438/151, 158, 474; 349/139, 143; 257/E51.005
See application file for complete search history.

(56) References Cited

U.S. PATENT DOCUMENTS

| | | | |
|---|---|---|---|
| 5,053,832 A * | 10/1991 | Uchida | 257/4 |
| 5,171,401 A | 12/1992 | Roselle | |
| 5,529,720 A | 6/1996 | Hayashi et al. | |
| 5,600,152 A * | 2/1997 | Kozuka et al. | 257/55 |
| 5,620,924 A * | 4/1997 | Takizawa et al. | 427/108 |
| 5,701,168 A | 12/1997 | Patel | |
| 5,779,802 A | 7/1998 | Borghs et al. | |
| 5,811,866 A * | 9/1998 | Hirata | 257/435 |
| 5,900,646 A * | 5/1999 | Takizawa et al. | 257/57 |

(Continued)

FOREIGN PATENT DOCUMENTS

| | | |
|---|---|---|
| JP | 62-051264 | 3/1987 |
| JP | 10-301127 | * 11/1998 |

OTHER PUBLICATIONS

Patent Abstracts of Japan, Method for Patterning Transparent Conductive Film, JP 10-301127, Yamamori Akiyoshi, Machine English Translation, Nov. 13, 1998.*

(Continued)

*Primary Examiner* — Khiem D Nguyen
(74) *Attorney, Agent, or Firm* — McKenna Long & Aldridge LLP

(57) ABSTRACT

An array substrate for use in an X-ray sensing device and in an LCD device is fabricated using plasma gas treatment. Especially, an indium-tin-oxide (ITO) transparent conductive metallic layer is plasma-treated by $N_2$ plasma, He plasma or Ar plasma, before forming the insulation layer on the ITO transparent conductive metallic layer. Thus, the plasma removes the impurities on a surface of the transparent conductive metallic layer and changes the lattice structure of the surface of the transparent conductive metallic layer, and thus the adhesion between the transparent conductive metallic layer and the insulation layer is improved. The defects caused by a gap or a space between the transparent conductive metallic layer and the insulation layer do not occur.

17 Claims, 5 Drawing Sheets

U.S. PATENT DOCUMENTS

| | | | |
|---|---|---|---|
| 6,060,826 | A | 5/2000 | Ueda et al. |
| 6,066,557 | A | 5/2000 | Lukanc et al. |
| 6,188,176 | B1 | 2/2001 | Nakaya et al. |
| 6,188,452 | B1 | 2/2001 | Kim et al. |
| 6,252,247 | B1 * | 6/2001 | Sakata et al. .............. 257/57 |
| 6,259,202 | B1 * | 7/2001 | Sturm et al. .............. 313/504 |
| 6,281,525 | B1 | 8/2001 | Krijn et al. |
| 6,300,152 | B1 * | 10/2001 | Kim .............. 438/30 |
| 6,338,990 | B1 * | 1/2002 | Yanai et al. .............. 438/160 |
| 6,344,884 | B1 * | 2/2002 | Kim et al. .............. 349/43 |
| 6,556,257 | B2 * | 4/2003 | Ino .............. 349/43 |
| 7,223,621 | B2 * | 5/2007 | Kim .............. 438/30 |
| 2004/0201048 | A1 | 10/2004 | Seki et al. |

OTHER PUBLICATIONS

Derwent-ACC-No. 2001-600582 "Method for forming pixel electrode of liquid crystal display device", Hwang, G J, LG Philips LCD CO LTD [GLDS], 2001.

* cited by examiner

METHOD OF FABRICATING AN ARRAY SUBSTRATE

CROSS REFERENCES TO RELATED APPLICATIONS

This application is a Continuation Application of U.S. patent application Ser. No. 09/793,103, filed on Feb. 27, 2001 now issued as U.S. Pat. No. 7,223,621, which claims priority to Korean Application No. 2000-9796, filed Feb. 28, 2000, all of which are hereby incorporated by reference as if fully set forth herein.

BACKGROUND OF THE INVENTION

1. Field of the Invention

The present invention relates to X-ray sensing devices and to liquid crystal display (LCD) devices. More particularly, it relates to a method of fabricating thin film transistor (TFT) array substrates for use in X-ray sensing devices and in LCD devices.

2. Description of Related Art

X-ray sensing devices (referred to as X-ray detectors hereinafter) and liquid crystal display (LCD) devices include thin film transistors (TFTs) as switching elements. The X-ray detectors act as sensing devices and the LCD devices act as displaying devices.

Since the X-ray detectors employ TMTs, the X-ray detectors have the advantage of providing real time diagnosis. Operating principles and configurations of the X-ray detectors are explained hereinafter.

FIG. 1 is a cross-sectional view illustrating one pixel of an array substrate of a related art X-ray detector. That X-ray detector includes a thin film transistor (TFT) "T" on a substrate 1, a photoconductive film 2, and various conductive elements that are described subsequently. Also included, but not shown in FIG. 1, are a scanning integrated circuit and a data integrated circuit.

Still referring to FIG. 1, the photoconductive film 2 produces electron-hole pairs 6 in proportion to the strength of incident radiation, such as X-rays. Thus, the photoconductive film 2 acts as a photoelectric transducer that converts incident X-rays into electron-hole pairs 6. An external voltage Ev is applied across a conductive electrode 7 to a pixel electrode 8. That voltage causes the electron-hole pairs 6 in the photoconductive film 2 to separate such that X-ray induced electrical charges accumulate on the pixel electrode 8. Those electrical charges are applied to a second capacitor electrode 13, and are consequently stored in a storage capacitor "S" formed by the second capacitor electrode 13 and a first capacitor electrode 11 that is formed over a ground line 9. The pixel electrode 8, the first capacitor electrode 11 and the second capacitor electrode 13 are beneficially comprised of a transparent conductive material such as Indium-Tin-Oxide (ITO). Furthermore, an insulating dielectric layer 15 is interposed between the first capacitor electrode 11 and the second electrode 13. That dielectric layer is beneficially comprised of Silicon Nitride ($SiN_x$).

When forming the first capacitor electrode 11, the transparent conductive material such as ITO is deposited and patterned at a temperature of 210 degrees Celsius. However, when forming the insulating dielectric layer 15, the deposition and patterning processes are performed, at a temperature of 250 degrees Celsius. Therefore, during the process of forming the insulating dielectric layer 15 after forming the first capacitor electrode 11, the higher temperature (250 degrees Celsius) affects a surface of the first capacitor electrode 11, and thus contact defects between the first capacitor electrode 11 and the insulating dielectric layer 15 occur. Namely, a gap or a space is formed in the interface where the first capacitor electrode 11 and the insulating dielectric layer 15 contact each other.

The problem described above also occurs in an array substrate for use in an LCD device. FIG. 2 is a cross-sectional view illustrating one pixel of a related art LCD device. As shown, the LCD device 21 has lower and upper substrates 25 and 29 and an interposed liquid crystal layer 31. The lower substrate 25 has the TFT "T" as a switching element to change an orientation of the liquid crystal molecules and includes a pixel electrode 23 to apply a voltage to the liquid crystal layer 31 according to signals of the TFT "T". And, a protective insulation layer 33 is formed on the pixel electrode 23 and on the TFF "T" to protect the pixel electrode 23 and the TFT "T". The upper substrate 29 has a common electrode 27 thereon. The common electrode 27 serves as an electrode for applying a voltage to the liquid crystal layer 31.

Still referring to FIG. 2, the pixel electrode 23 contacts the drain electrode of the TFT "T" and applies a signal received therefrom to the liquid crystal layer 31. Thus, the signal re-arranges the liquid crystal molecules into a determined pattern due to a spontaneous polarization in accordance with the applied signal. The LCD device displays images, due to the fact that the transmittance of light generated from a backlight device (not shown) is controlled by the re-arrangement of the liquid crystal molecules. Meanwhile, the pixel electrode 23 is formed of ITO as in the case of the X-ray detector described above, and the protective insulation layer 33 is formed of silicon nitride ($SiN_x$).

In the above-mentioned LCD device, during the process of forming the protective insulation layer after forming the pixel electrode, the higher temperature (250 degrees Celsius) affects the surface of the pixel electrode, and thus contact defects between the pixel electrode and the protective insulation layer occur. Namely, a gap or a space, as described in the case of the X-ray detector, is formed in the interface where the pixel electrode and the protection layer touch each other. These gaps or spaces decrease the manufacturing yield and throughput.

SUMMARY OF THE INVENTION

This invention has been developed in order to address the above-described problem.

An object of this invention is to provide an array substrate for use in an X-ray sensing device and in an LCD device. Furthermore, it is an object of the present invention to reduce defects occurring in the interface where the transparent conductive metallic layer and insulating layer touch each other.

Additional features and advantages of the invention will be set forth in the description that follows, and in part will be apparent from that description, or may be learned by practice of the invention. The objectives and other advantages of the invention will be realized and attained by the structure particularly pointed out in the written description and claims hereof as well as the appended drawings.

In order to accomplish the above object, the principles of the present invention provide a method of fabricating an array substrate for use in an X-ray sensing device and in an LCD device, the array substrate having gate, source and drain electrodes as a switching element, and a transparent conductive metallic layer, the method including: treating a surface of the transparent conductive metallic layer with plasma gas; and forming an insulation layer on the transparent conductive metallic layer and over the switching element.

The insulation layer is beneficially made of silicon nitride (SiNx), and the transparent conductive metallic layer is beneficially made of ITO (indium-tin-oxide).

The transparent conductive metallic layer is a pixel electrode that contacts the drain electrode or is one of the capacitor electrodes.

The plasma gas beneficially includes one of nitrogen (N), helium (He) and argon (Ar).

It is to be understood that both the foregoing general description and the following detailed description are exemplary and explanatory and are intended to provide further explanation of the invention as claimed.

BRIEF DESCRIPTION OF THE DRAWINGS

For a more complete understanding of the present invention and the advantages thereof, reference is now made to the following description taken in conjunction with the accompanying drawings, in which like reference numerals denote like parts, and in which.

DETAILED DESCRIPTION OF ILLUSTRATED EMBODIMENTS

Reference will now be made in detail to illustrated embodiments of the present invention, examples of which are shown in the accompanying drawings.

Figure 1:
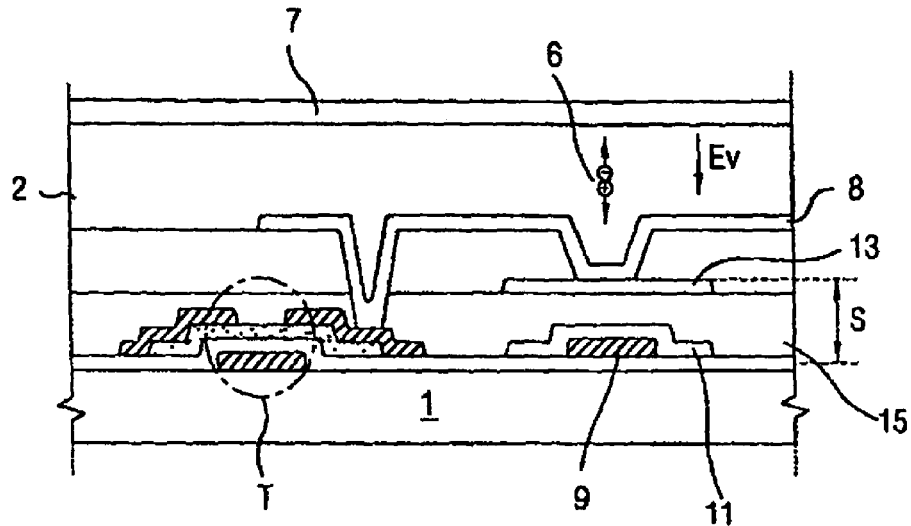
FIG. 1 is a cross-sectional view of one pixel of a conventional X-ray sensing device.
Figure 2:
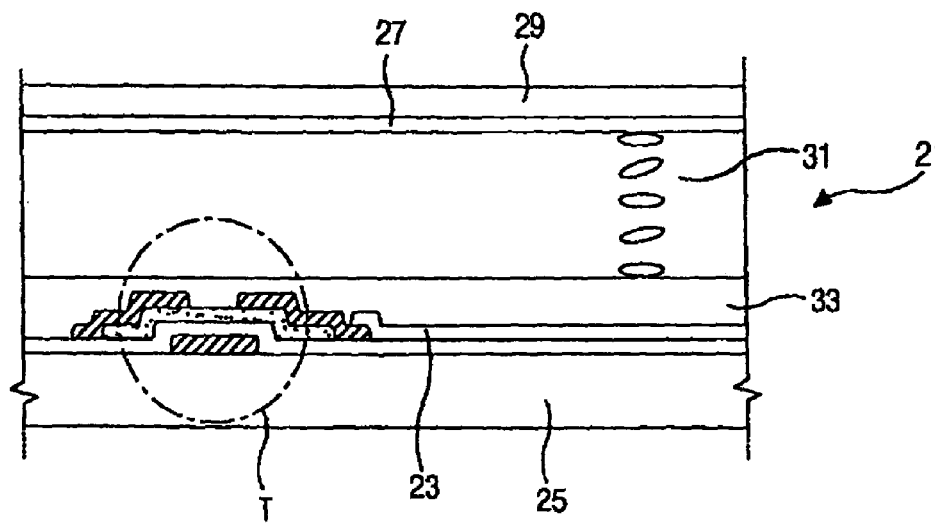
FIG. 2 is a cross-sectional view of one pixel of a conventional LCD device.
Figure 3:
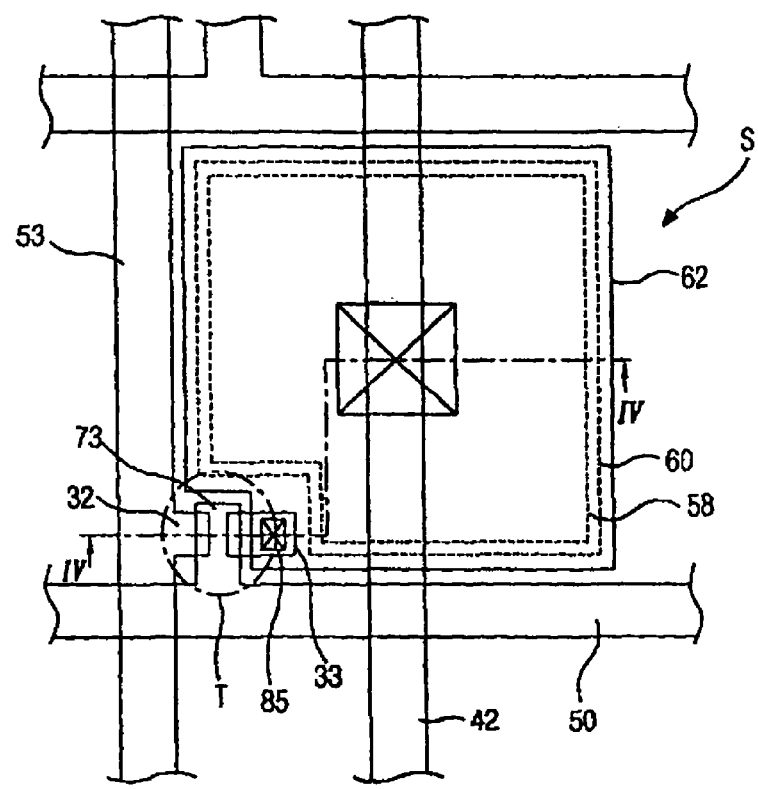
FIG. 3 is a partial plan view of an array substrate for use in an X-ray detector that is in accord with the principles of the present invention.

FIG. 3 is a plan view illustrating one pixel of an array substrate for an X-ray detector according to one embodiment. As shown, gate line 50 is arranged in a transverse direction and data line 53 is arranged in a longitudinal direction. A TFT "T" is formed near the crossing of the gate and data lines 50 and 53. The TFT acts as a switching element and comprises gate, source and drain electrodes 73, 32 and 33 respectively. A ground line 42 is arranged perpendicular to the gate line 50. That ground line 42 crosses a storage capacitor region "S". The ground line 42 acts as a common line for neighboring pixels.

A first capacitor electrode 58 and a second capacitor electrode 60 of a storage capacitor "S" are located in a pixel area, with the pixel area being the region between the gate and data lines. Additionally, although not shown in FIG. 3, a dielectric insulation layer 81 (see FIG. 4D) of Silicon Nitride ($SiN_x$) is interposed between first capacitor electrode 58 and the second capacitor electrode 60. Pixel electrode 62 that extends over the TFT "T" is then located in the pixel area. Although not shown in FIG. 3, in order to store the charges which are generated in the photoconductive film (not shown), the pixel electrode 62 electrically connects to the second capacitor electrode 60 of that pixel. Furthermore, the pixel electrode 62 is electrically connected to the drain electrode 33 of that pixel's TFT "T" via a drain contact hole 85.

An operating principle of the x-ray detector will be explained hereinafter. The charges generated in the photoconductive film (not shown) are gathered in the pixel electrode 62 and stored in the storage capacitor "S" that is comprised of the second capacitor electrode 60, the first capacitor electrode 58 and the dielectric insulation layer (not shown). These stored charges transfer to the drain electrode 33 through the pixel electrode 62, and display the X-ray images.

The fabrication steps of the array substrate illustrated in FIG. 3 will be explained with reference to FIGS. 4A to 4D, which are cross-sectional views taken along lines IV-IV.

Figure 4A:
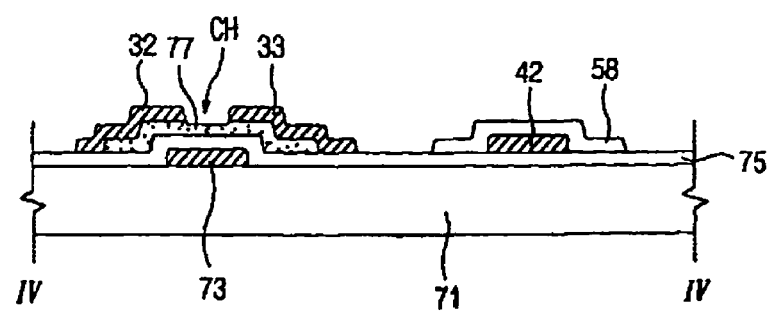
FIG. 4A to 4D are cross-sectional views taken along line IV-IV of FIG. 3.

Referring to FIG. 4A, a first metal layer is formed on a substrate 71 by depositing a metallic material such as Aluminum (Al), Al-alloy, Molybdenum (Mo), Tantalum (Ta), Tungsten (W), Niobium (Nb) or Antimony (Sb). A gate line (see element 50 of FIG. 3) and a gate electrode 73 that extends from the gate line are then formed by patterning the first metal layer. Then, a first insulation layer 75 is deposited over the substrate 71 and over the first patterned metal layer. The first insulation layer 75 can be comprised of an inorganic substance, such as Silicon Nitride ($SiN_x$) or Silicon Oxide ($SiO_x$), or of an organic substance such as BCB (Benzocyclobutene) or an acryl. Silicon Nitride ($SiN_x$) is assumed to be employed hereinafter.

Still referring to 4A, a pure amorphous silicon (a-Si:H) layer and a doped amorphous silicon ($n^+$ a-Si:H) layer are sequentially formed over the first insulation layer 75. Those silicon layers are then patterned in an island shape to form a semiconductor layer 77. Either CVD (Chemical Vapor Deposition) or the ion injection method is used to form the doped amorphous silicon layer. CVD is beneficially employed in the present invention.

Next, a source electrode 32, a drain electrode 33, and a ground line 42 are then formed by depositing a second metal layer. The second metal layer is then patterned to form the source electrode 32, which extends from the data line (reference element 53 of FIG. 3) over the gate electrode 73; the drain electrode 33, which is spaced apart from the source electrode 32 and over the gate electrode 73; and the ground line 42, which crosses under the storage capacitor "S" (see FIG. 3). A portion of the doped amorphous silicon layer of the semiconductor layer 77 is then etched to form a channel region "CH" using the source and drain electrodes 32 and 33 as masks. Thus, the TFT "T" (see FIG. 3) is complete.

Next, the first capacitor electrode 58 is formed over the ground line 42 by depositing and patterning a transparent conductive material such as Indium-Tin-Oxide (ITO). The first capacitor electrode 58 is in electrical contact with the ground line 42. At this time, the first capacitor electrode 58 can exchange places with the ground line 42.

Figure 4B:
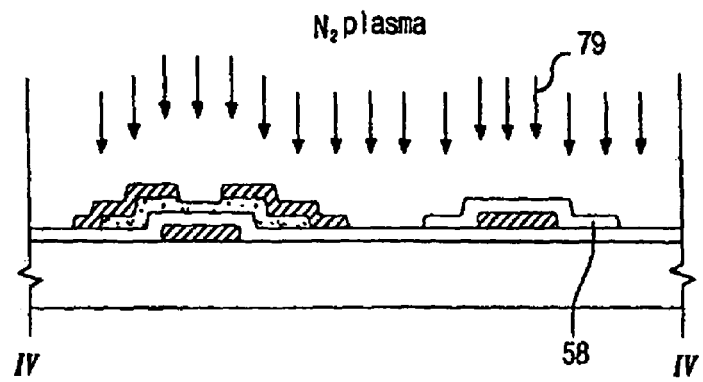

FIG. 4B shows a step of performing an $N_2$ plasma process. As shown, the surface of the first capacitor electrode 58 is plasma-treated by the $N_2$ plasma gas 79. The $N_2$ plasma gas 79, which is accelerated and then strikes against the surface of the first capacitor electrode 58, removes the impurities that adhere to a surface of the first capacitor electrode 58. Simultaneously, the $N_2$ plasma gas 79 changes the lattice structure of the surface of the first capacitor electrode 58. Therefore, the interface characteristics, between the first capacitor electrode 58 and a dielectric insulation layer that is formed in a later step, are sufficiently improved. Namely, the plasma treatment, which is performed before forming the dielectric insulation layer, is an important process because it prevents product defects, such as a gap or a space between the first capacitor electrode 58 and a dielectric insulation layer. In the above-mentioned plasma treatment, an inert gas such as argon (Ar) or helium (He) can be used instead of $N_2$ gas.

Figure 4C:
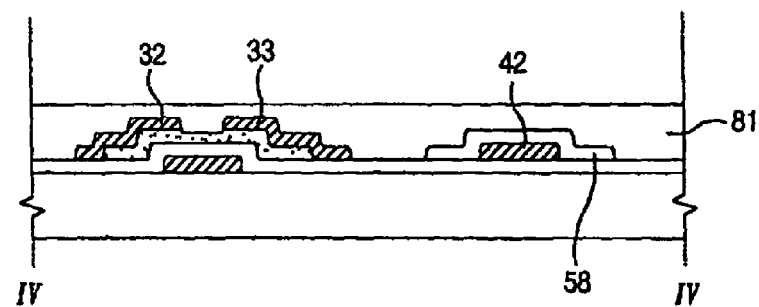

Referring to FIG. 4C, a dielectric insulation layer 81 is then formed over the TFT, over the first capacitor electrode 58, and over the first insulation layer 75 by depositing Silicon Nitride ($SiN_x$). The step of performing the plasma treatment and the step of forming the dielectric protection layer can be conducted in the same chamber.

Figure 4D:
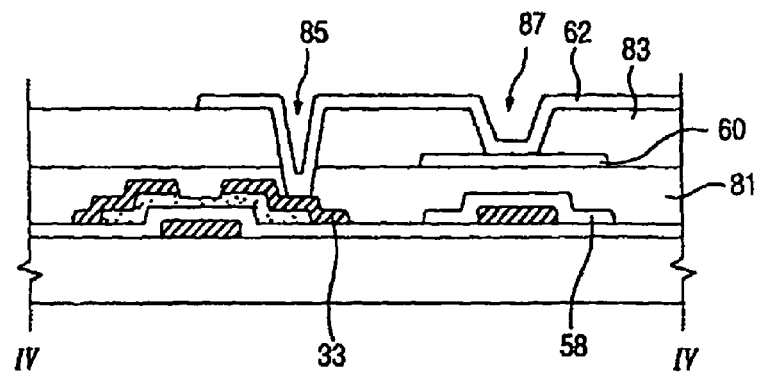

Referring to FIG. 4D, a second capacitor electrode 60, which corresponds in size to the first capacitor electrode 58, is then formed on the dielectric insulation layer 81 and over the first capacitor electrode 58. The second capacitor electrode 60 is beneficially comprised of a transparent conductive material such as Indium-Tin-Oxide (ITO). A second insulation layer 83 is then formed, beneficially by depositing an organic substance such as BCB (Benzocyclobutene). BCB is a good choice because it has a low dielectric permittivity.

Next, the second insulation layer 83 and the dielectric insulation layer 81 are etched to form a drain contact hole 85 over the drain electrode 33. Simultaneously, a capacitor electrode contact hole 87 is formed by etching the second insulation layer 83 over the second capacitor electrode 60.

Still referring now to FIG. 4D, a pixel electrode 62, which connects to the drain electrode 33 via the drain contact hole 85, and to the second capacitor electrode 60 via the capacitor electrode contact hole 87, is formed by depositing and patterning a transparent conductive material such as ITO.

With respect to the above-mentioned processes, since the surface of the first capacitor electrode is plasma-treated by the $N_2$ plasma before forming the dielectric insulation layer on the first capacitor electrode, the interface characteristics between the dielectric insulation layer and the first capacitor electrode are improved. And thus, the gaps or the spaces are prevented from being formed in the interface where the first capacitor electrode and the dielectric insulation layer contact each other.

Figure 5:
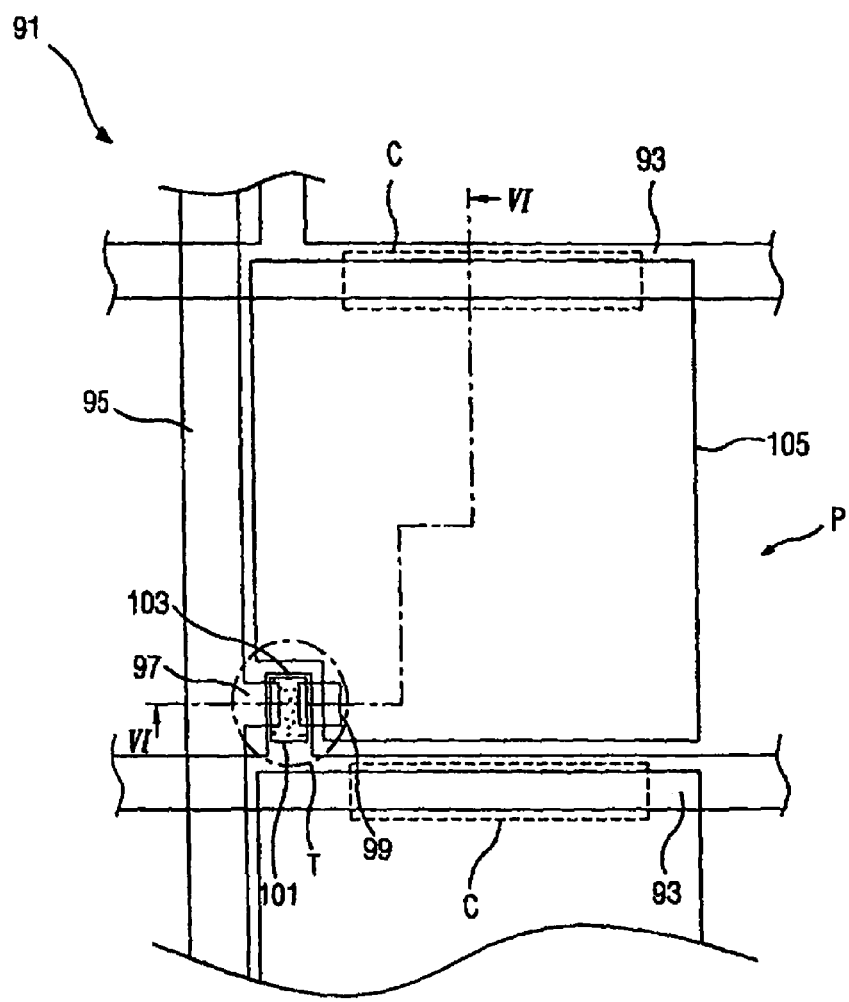
FIG. 5 is a partial plan view of an array substrate for use in an LCD device in accord with the principles of the present invention.

FIG. 5 is a plan view of one pixel of an array substrate for use in an LCD device. As shown, the array substrate for use in the LCD device is generally comprised of a TFT "T", a pixel "P" and gate and data lines 93 and 95. The gate line 93 and data line 95 cross each other and define the pixel region "P". The TFT "T" is positioned near the crossing of the gate line 93 and the data line 95. The TFT "T" also includes a gate electrode 103 that extends from the gate line 93, an active layer 101, a source electrode 97 that extends from the data line 95 and overlaps one end of the gate electrode 103, and a drain electrode 99 that is spaced apart from the source electrode 97 and overlaps the other end of the gate electrode 103. A pixel electrode 105 is formed in the pixel region "P" and directly contacts the drain electrode 99. Some portion of the pixel electrode 105 overlaps the gate line 93 and forms a storage capacitor "C" with the gate line 93 and with a first insulation layer (See FIG. 6C).

The fabrication steps of the array substrate illustrated in FIG. 5 will be explained with reference to FIGS. 6A to 6E, which are cross-sectional views taken along line VI-VI of FIG. 5.

Figure 6A:
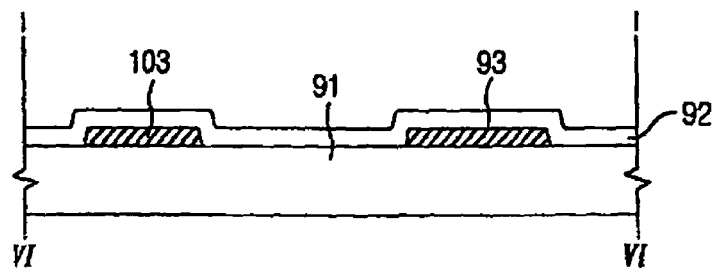
FIG. 6A to 6E are cross-sectional views taken along line VI-VI of FIG. 5.

Referring now to FIG. 6A, a first metal layer is formed on a substrate 91 by depositing a metallic material such as Aluminum (Al), Al-alloy, Molybdenum (Mo), Tantalum (Ta), Tungsten (W), Niobium (Nb) or Antimony (Sb). The first metal layer is patterned to form a gate line 93 and a gate electrode 103 that extends from the gate line 93. After the first metal layer is patterned, a first insulation layer 92 is formed on the substrate 91 and over the patterned first metal layer. Beneficially, the first insulation layer 92 is an inorganic substance such as Silicon Nitride ($SiN_x$) or Silicon Oxide ($SiO_x$).

Figure 6B:
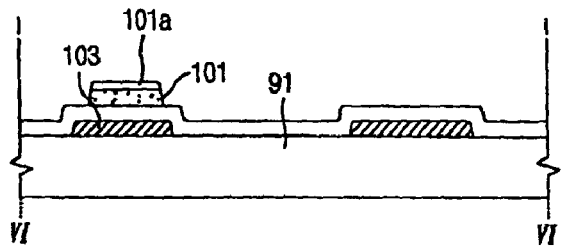

Referring now to FIG. 6B, a pure amorphous silicon (a-Si: H) layer and a doped amorphous silicon ($n^+$ a-Si:H) layer are then sequentially formed over the first insulation layer 92. Those silicon layers are then patterned to form an active layer 101 and an ohmic contact layer 101a in an island shape. Either CVD (Chemical Vapor Deposition) or an ion injection method is beneficial in forming the doped amorphous silicon layer.

Figure 6C:
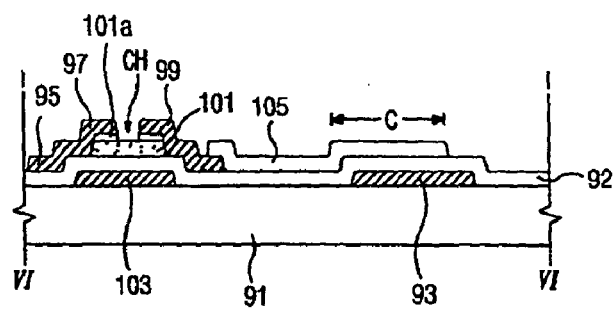

Referring now to FIG. 6C, a source electrode 97, a drain electrode 99, and a data line 95 are then formed. First, a second metal layer is deposited. That second metal layer is then patterned to form the source electrode 97, the drain electrode 99, and the data line 95. Referring now to both FIG. 5 and FIG. 6C, the source electrode 97 is formed over the gate electrode 103 as an extension of the data line 95. The drain electrode 99 is formed over part of the gate electrode 103 and spaced apart from the source electrode 97. A portion of the to ohmic contact layer 101a on the active layer 101 is then etched to form a channel region "CH" using the source and drain electrodes 97 and 99 as masks. Thus, the TFT "T" (see FIG. 5) is completed.

Still referring to FIG. 6C, a pixel electrode 105 is then formed on the first insulation layer 92 by depositing and patterning a transparent conductive material such as Indium-Tin-Oxide (ITO). As shown, the pixel electrode 105 is in contact with the drain electrode 99 by overlapping one end of the drain electrode 99. Moreover, the pixel electrode 105 overlaps some portion of the gate line 93, and thus a storage capacitor "C" is formed. Namely, the storage capacitor "C" is comprised of the gate line 93, the pixel electrode 105, and the interposed first insulation layer 92.

Figure 6D:
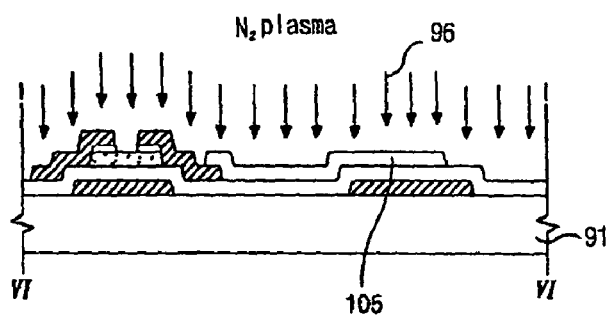

Referring now to FIG. 6D, an $N_2$ plasma process is performed. As shown, a surface of the pixel electrode 105 is plasma-treated by the $N_2$ plasma gas 96. The $N_2$ plasma gas 96, which is accelerated and then strikes against the surface of the pixel electrode 105, removes the impurities that adhere to the surface of the pixel electrode 105. Simultaneously, the $N_2$ plasma gas 96 changes the lattice structure of the surface of the pixel electrode 105. Therefore, the interface characteristics, between the pixel electrode 105 and a second insulation layer that is formed in a later step, are sufficiently improved. Namely, the plasma treatment, which is performed before forming the second insulation layer, is an important process because it prevents the product defects as described above with respect to the X-ray detector. In the above-mentioned plasma treatment, an inert gas such as argon (Ar) or helium (He) can be used instead of $N_2$ gas.

Figure 6E:
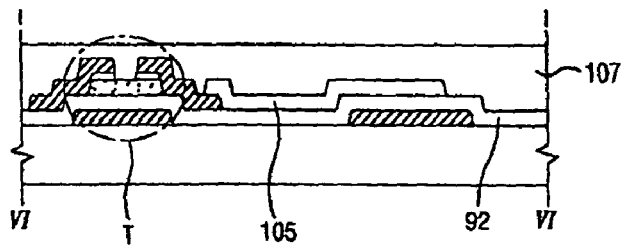

Referring to FIG. 6E, a Silicon Nitride ($SiN_x$) insulation layer 107 is then formed over the TFT "T," over the pixel electrode 105 and over the first insulation layer 92. The step of performing the plasma treatment and the step of forming the insulation layer 107 can be conducted in the same chamber.

As described above, it is desirable that the ITO electrode is plasma-treated by the $N_2$ plasma before forming the insulation layer on the ITO. Accordingly, in the illustrated embodiment of the present invention, since the capacitor and pixel electrode that are made of the transparent conductive material such as ITO (indium-tin-oxide) are plasma-treated by the $N_2$ plasma gas, the interface characteristics are improved, and the gaps or spaces are prevented between the transparent conductive material and the silicon (Si)-based layer. Therefore, the manufacturing yield is raised, and the manufacturing defects caused in the array substrate are decreased. The throughput of the array substrate is also increased.

Other embodiments and features of the invention will be apparent to the skilled in the art from consideration of the specification and practice of the invention disclosed herein. It is intended that the specification and examples be considered as exemplary only, with the true scope and spirit of the invention being indicated by the following claims.

What is claimed is:

1. A method of fabricating an array substrate, the array substrate having a switching element with a gate electrode, a first insulation layer on the gate electrode, source and drain electrodes over the first insulation layer, and a transparent conductive metallic layer, the method comprising:

treating a surface of the transparent conductive metallic layer with a plasma gas to remove impurities and change a lattice structure of the transparent conductive metallic layer, wherein each of the source and drain electrodes includes a metallic material, and wherein the transparent conductive metallic layer is formed on the first insulation layer and spaced apart from the source electrode; and forming a second insulation layer in physical contact with a top surface of the transparent conductive metallic layer having the surface treated with the plasma gas and over the switching element, wherein treating the surface of the transparent conductive metallic layer with plasma gas and forming the second insulation layer are performed in a same chamber.

2. A method of fabricating an array substrate according to claim 1, wherein the insulation layer is made of silicon nitride (SiNx).

3. A method of fabricating an array substrate according to claim 1, wherein the treated transparent conductive metallic layer is made of ITO (indium-tin-oxide).

4. A method of fabricating an array substrate according to claim 3, wherein the treated transparent conductive metallic layer forms a pixel electrode that contacts the drain electrode.

5. A method of fabricating an array substrate according to claim 3, wherein the treated transparent conductive metallic layer forms a capacitor electrodes.

6. A method of fabricating an array substrate according to claim 1, wherein the plasma gas includes one of nitrogen (N), helium (He) and argon (Ar).

7. A method of fabricating an array substrate according to claim 1, wherein the plasma gas includes nitrogen (N).

8. A method of fabricating an array substrate, comprising:

forming a switching device on the substrate, wherein the switching device includes a gate electrode, a first insulation layer on the gate electrode, and source and drain electrodes over the first insulation layer and each of the source and drain electrodes includes a metallic material;

forming a transparent conductive material on the first insulation layer, wherein the transparent conductive material is spaced apart from the source electrode;

exposing a surface of the transparent conductive material on the first insulation layer with a plasma gas to remove impurities and change a lattice structure of the transparent conductive material; and depositing an insulating material in physical contact with a top surface of the transparent conductive material having the surface exposed with the plasma gas to form a second insulation layer, wherein exposing the surface of the transparent conductive material with the plasma gas and depositing the insulating material are performed in a same chamber.

9. The method of claim 8, further comprising patterning the transparent conductive material prior to exposing the surface of the transparent conductive material with the plasma gas.

10. The method of claim 8, wherein the switching device is a thin film transistor having gate, source, and drain electrodes.

11. The method of claim 10, wherein the transparent conductive material forms a capacitor electrodes.

12. The method claim 11, wherein the capacitor electrode is a pixel electrode that contacts the drain electrode.

13. The method claim 8, further comprising depositing a metal layer on the insulating material.

14. The method of claim 8, wherein the insulation layer is made of silicon nitride (SiNx).

15. The method of claim 8, wherein the transparent conductive metallic material is made of ITO (indium-tin-oxide).

16. The method of claim 8, wherein the plasma gas includes one of nitrogen (N), helium (He) and argon (Ar).

17. A method of fabricating an array substrate according to claim 8, wherein the plasma gas includes nitrogen (N).

* * * * *